(12) United States Patent
Shih et al.

(10) Patent No.: US 10,672,979 B1
(45) Date of Patent: Jun. 2, 2020

(54) METHOD FOR FABRICATING MAGNETORESISTIVE RANDOM ACCESS MEMORY

(71) Applicant: UNITED MICROELECTRONICS CORP., Hsin-Chu (TW)

(72) Inventors: Yi-An Shih, Changhua County (TW); I-Ming Tseng, Kaohsiung (TW); Yi-Hui Lee, Taipei (TW); Ying-Cheng Liu, Tainan (TW); Yu-Ping Wang, Taoyuan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/281,103

(22) Filed: Feb. 21, 2019

(30) Foreign Application Priority Data

Jan. 23, 2019 (CN) .......................... 2019 1 0062002

(51) Int. Cl.
*H01L 43/12* (2006.01)
*G11C 11/15* (2006.01)
*H01L 43/02* (2006.01)
*H01L 27/22* (2006.01)

(52) U.S. Cl.
CPC .............. *H01L 43/12* (2013.01); *G11C 11/15* (2013.01); *H01L 27/224* (2013.01); *H01L 43/02* (2013.01)

(58) Field of Classification Search
None
See application file for complete search history.

(56) References Cited

U.S. PATENT DOCUMENTS

| | | | |
|---|---|---|---|
| 7,776,696 B2 * | 8/2010 | Khan | H01L 21/31144 257/E21.624 |
| 9,608,040 B2 * | 3/2017 | Baek | H01L 27/228 |
| 10,193,060 B2 * | 1/2019 | Han | H01L 27/228 |
| 10,199,572 B2 * | 2/2019 | Yi | H01L 27/228 |
| 10,347,821 B2 * | 7/2019 | Lu | H01L 43/02 |
| 10,395,979 B2 * | 8/2019 | Kim | H01L 43/12 |
| 10,396,277 B2 * | 8/2019 | Lee | G11C 11/161 |
| 10,446,745 B1 * | 10/2019 | Hung | H01L 27/222 |
| 2008/0157156 A1 * | 7/2008 | Kanakasabapathy | H01L 23/544 257/295 |
| 2009/0059656 A1 * | 3/2009 | Kanakasabapathy | H01L 23/544 365/158 |
| 2011/0089507 A1 * | 4/2011 | Mao | H01L 27/222 257/421 |
| 2015/0069480 A1 * | 3/2015 | Kanaya | H01L 27/222 257/295 |
| 2015/0311253 A1 * | 10/2015 | Choi | H01L 27/228 257/252 |
| 2017/0345869 A1 * | 11/2017 | Park | H01L 27/222 |
| 2018/0233663 A1 * | 8/2018 | Shum | H01L 27/228 |

* cited by examiner

*Primary Examiner* — Andres Munoz
(74) *Attorney, Agent, or Firm* — Winston Hsu

(57) ABSTRACT

A method for fabricating semiconductor device includes the steps of: forming an inter-metal dielectric (IMD) layer on a substrate; forming a metal interconnection in the IMD layer; forming a bottom electrode layer on the IMD layer; forming a cap layer on the bottom electrode layer; and removing part of the cap layer, part of the bottom electrode layer, and part of the IMD layer to form a trench.

7 Claims, 7 Drawing Sheets

US 10,672,979 B1

METHOD FOR FABRICATING MAGNETORESISTIVE RANDOM ACCESS MEMORY

BACKGROUND OF THE INVENTION

1. Field of the Invention

The invention relates to a method for fabricating semiconductor device, and more particularly to a method for fabricating magnetoresistive random access memory (MRAM).

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a method for fabricating semiconductor device includes the steps of: forming an inter-metal dielectric (IMD) layer on a substrate; forming a metal interconnection in the IMD layer; forming a bottom electrode layer on the IMD layer; forming a cap layer on the bottom electrode layer; and removing part of the cap layer, part of the bottom electrode layer, and part of the IMD layer to form a trench.

According to an embodiment of the present invention, a planarizing process is performed to remove the cap layer after forming the trench.

According to an embodiment of the present invention, the planarizing process preferably includes a chemical mechanical polishing (CMP) process.

According to an embodiment of the present invention, a free layer is formed on the bottom electrode layer after performing the planarizing process, a top electrode layer is formed on the free layer, and patterning the top electrode layer, the free layer, and the bottom electrode layer to form a magnetic tunneling junction (MTJ).

According to an embodiment of the present invention, the bottom electrode layer preferably includes tantalum nitride (TaN).

According to an embodiment of the present invention, the cap layer preferably includes tetraethyl orthosilicate (TEOS).

According to an embodiment of the present invention, the cap layer preferably includes silicon nitride.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
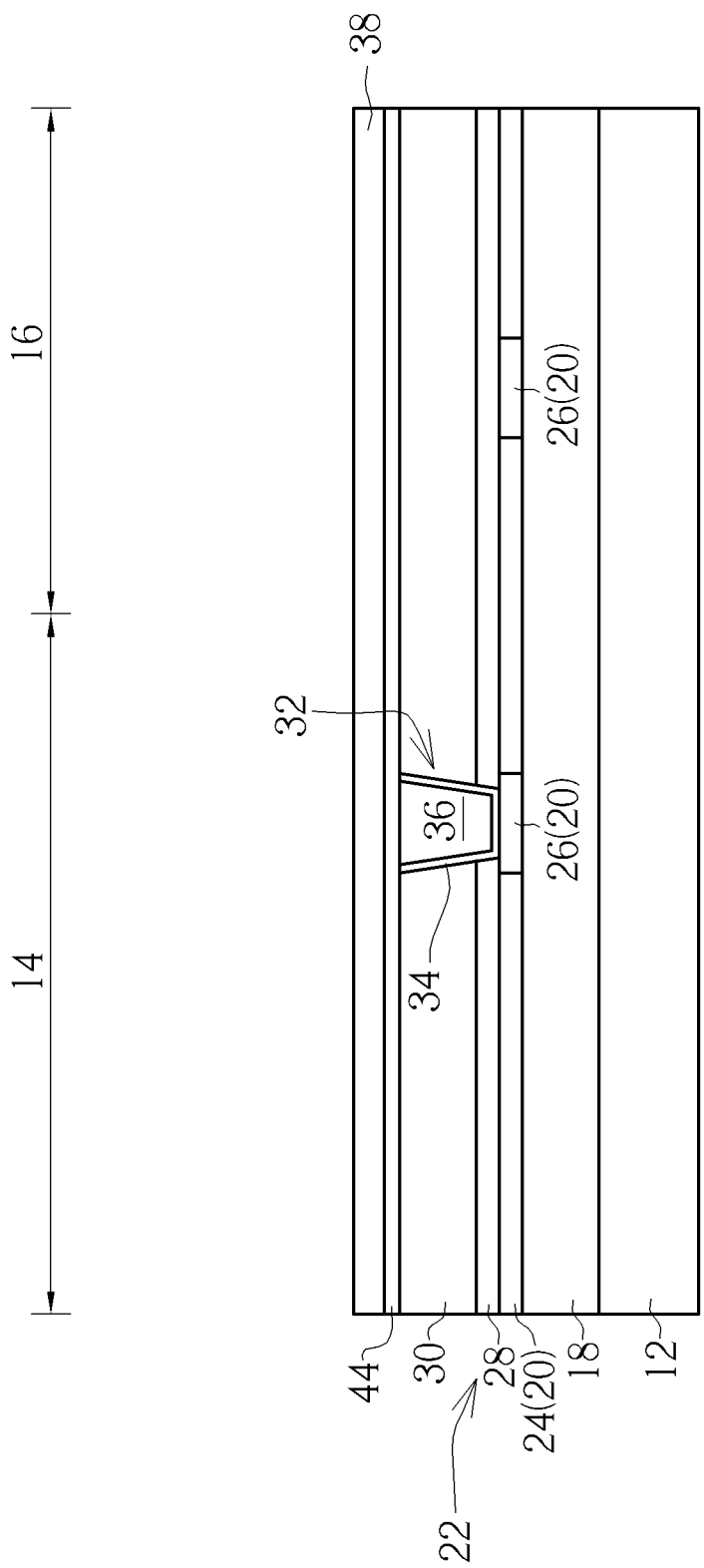
FIGS. 1-7 illustrate a method for fabricating a MRAM device according to an embodiment of the present invention.

Referring to FIGS. 1-7, FIGS. 1-7 illustrate a method for fabricating a semiconductor device, or more specifically a MRAM device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MTJ region 14 and a logic region 16 are defined on the substrate 12.

Active devices such as metal-oxide semiconductor (MOS) transistors, passive devices, conductive layers, and interlayer dielectric (ILD) layer 18 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region, spacer, epitaxial layer, and contact etch stop layer (CESL). The ILD layer 18 could be formed on the substrate 12 to cover the MOS transistors, and a plurality of contact plugs could be formed in the ILD layer 18 to electrically connect to the gate structure and/or source/drain region of MOS transistors. Since the fabrication of planar or non-planar transistors and ILD layer is well known to those skilled in the art, the details of which are not explained herein for the sake of brevity.

Next, metal interconnect structures 20, 22 are sequentially formed on the ILD layer 18 on the MTJ region 14 and the logic region 16 to electrically connect the aforementioned contact plugs, in which the metal interconnect structure 20 includes an inter-metal dielectric (IMD) layer 24 and metal interconnections 26 embedded in the IMD layer 24, and the metal interconnect structure 22 includes a stop layer 28, an IMD layer 30, and metal interconnection 32 embedded in the stop layer 28 and the IMD layer 30.

In this embodiment, each of the metal interconnections 26 from the metal interconnect structure 20 preferably includes a trench conductor 46 and each of the metal interconnection 32 from the metal interconnect structure 22 on the MTJ region 14 includes a via conductor. Preferably, each of the metal interconnections 26, 32 from the metal interconnect structures 20, 22 could be embedded within the IMD layers 24, 30 and/or stop layer 28 according to a single damascene process or dual damascene process. For instance, each of the metal interconnections 26, 32 could further includes a barrier layer 34 and a metal layer 36, in which the barrier layer 34 could be selected from the group consisting of titanium (Ti), titanium nitride (TiN), tantalum (Ta), and tantalum nitride (TaN) and the metal layer 36 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers 36 are preferably made of copper, the IMD layers 24, 30 are preferably made of silicon oxide, and the stop layer 28 is preferably made of nitrogen doped carbide (NDC), silicon nitride, silicon carbon nitride (SiCN), or combination thereof.

Next, a bottom electrode layer 44 and a cap layer 38 are formed on the IMD layer 30. In this embodiment, the bottom electrode 44 preferably includes conductive material such as TaN, but could also include other material including but not limited to for example Ta, Pt, Cu, Au, Al, or combination thereof. The cap layer 38 on the other hand is preferably made of a material not containing oxygen or a material capable of preventing the bottom electrode layer 44 from contacting oxygen directly to form oxidized material. In this embodiment, the cap layer 38 is preferably made of tetraethyl orthosilicate (TEOS) or silicon nitride (SiN).

Figure 2:
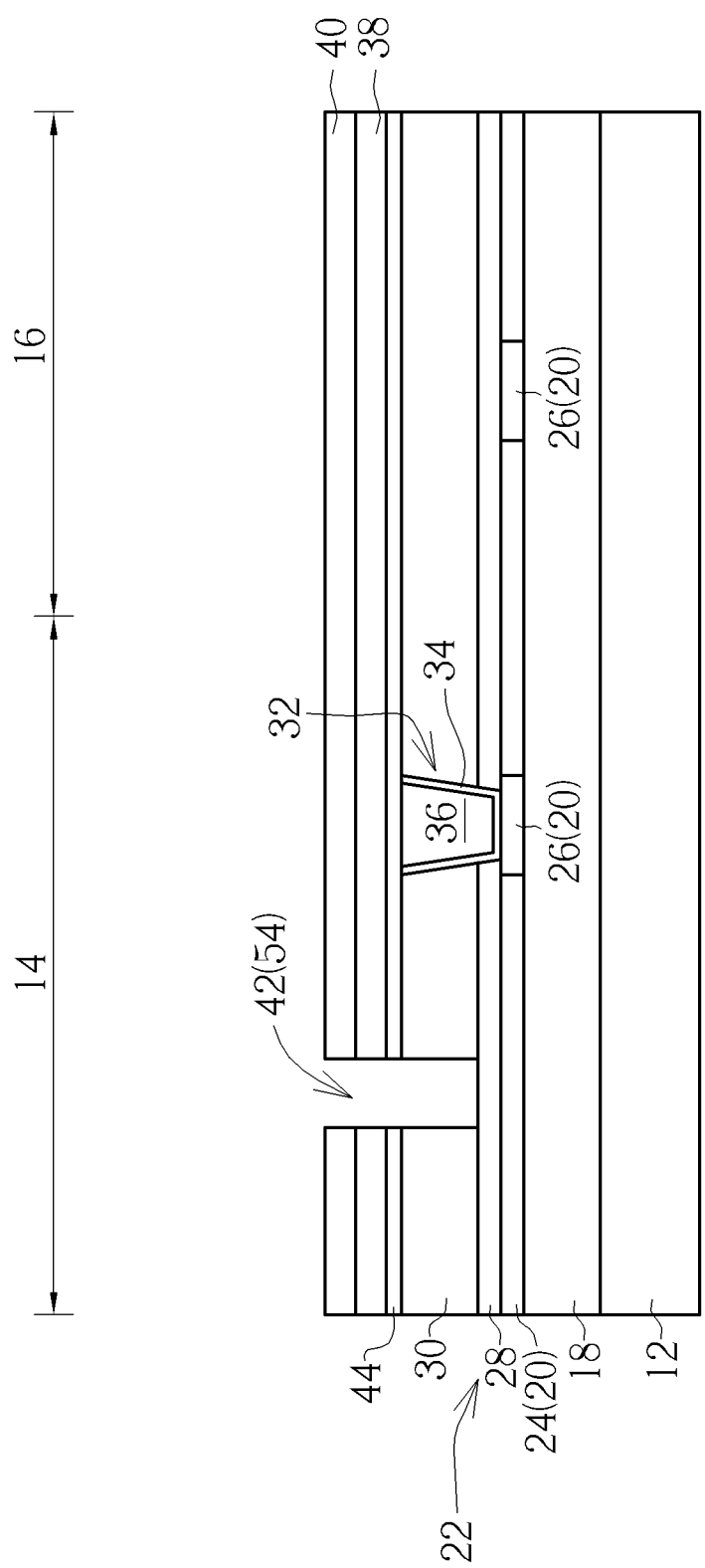

Next, as shown in FIG. 2, a patterned mask 40 such as a patterned resist is formed on the cap layer 38, in which the patterned mask 40 preferably includes an opening (not shown) exposing part of the cap layer 38 surface. Next, an etching process is conducted by using the patterned mask 40 as mask to remove part of the cap layer 38, part of the bottom electrode layer 44, and part of the IMD layer 30 to forma trench 42 serving as an alignment mark 54. In this embodiment, the bottom surface of the trench 42 is preferably even with the bottom surface of the IMD layer 30 or top surface of the stop layer 28. Nevertheless, according to an embodiment of the present invention the bottom surface of the trench 42 could also be slightly higher than the bottom surface of the IMD layer 30, slightly lower than the bottom surface of the IMD layer 30, or even extended into part of the stop layer 28, which are all within the scope of the present invention.

Figure 3:
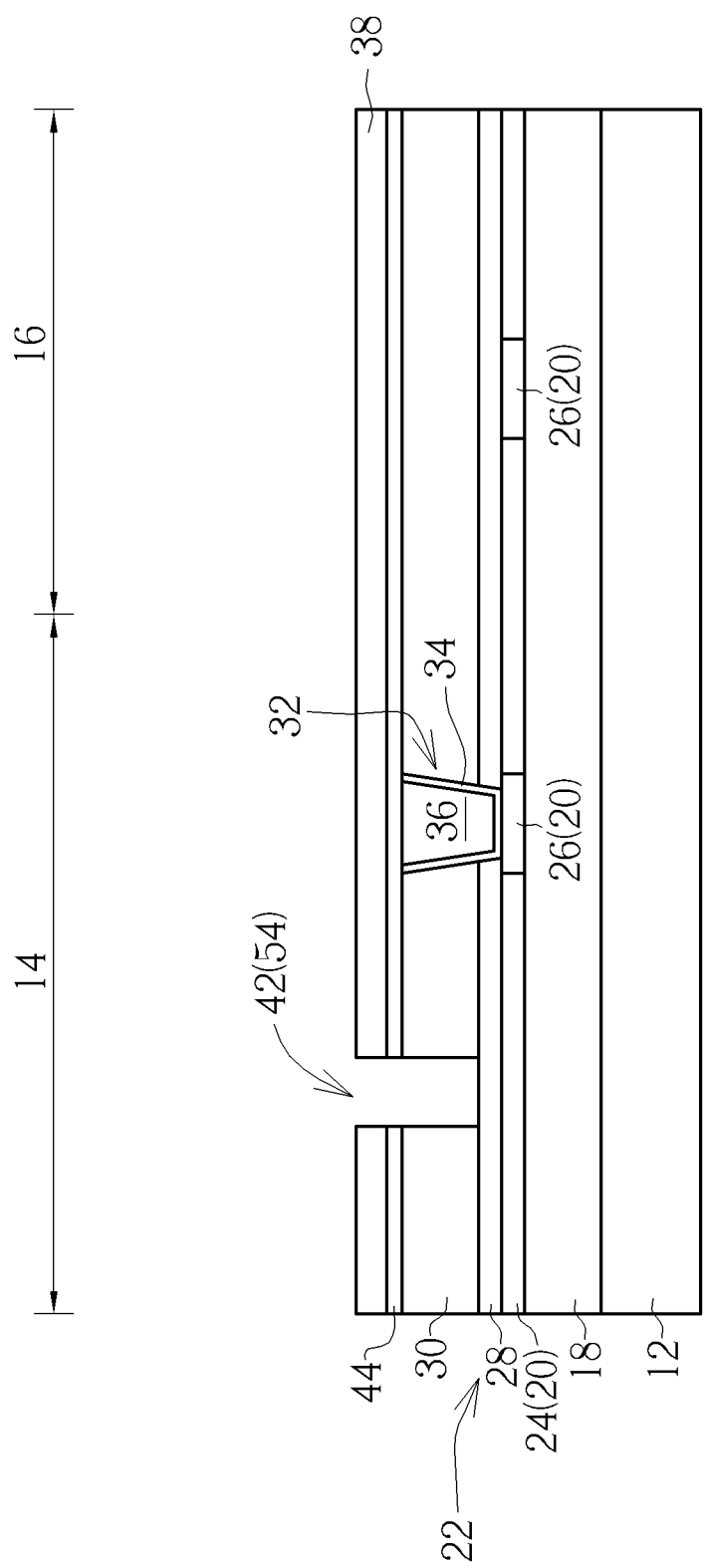

Next, as shown in FIG. 3, the patterned mask 40 is stripped to expose the top surface of the cap layer 38 once again.

Figure 4:
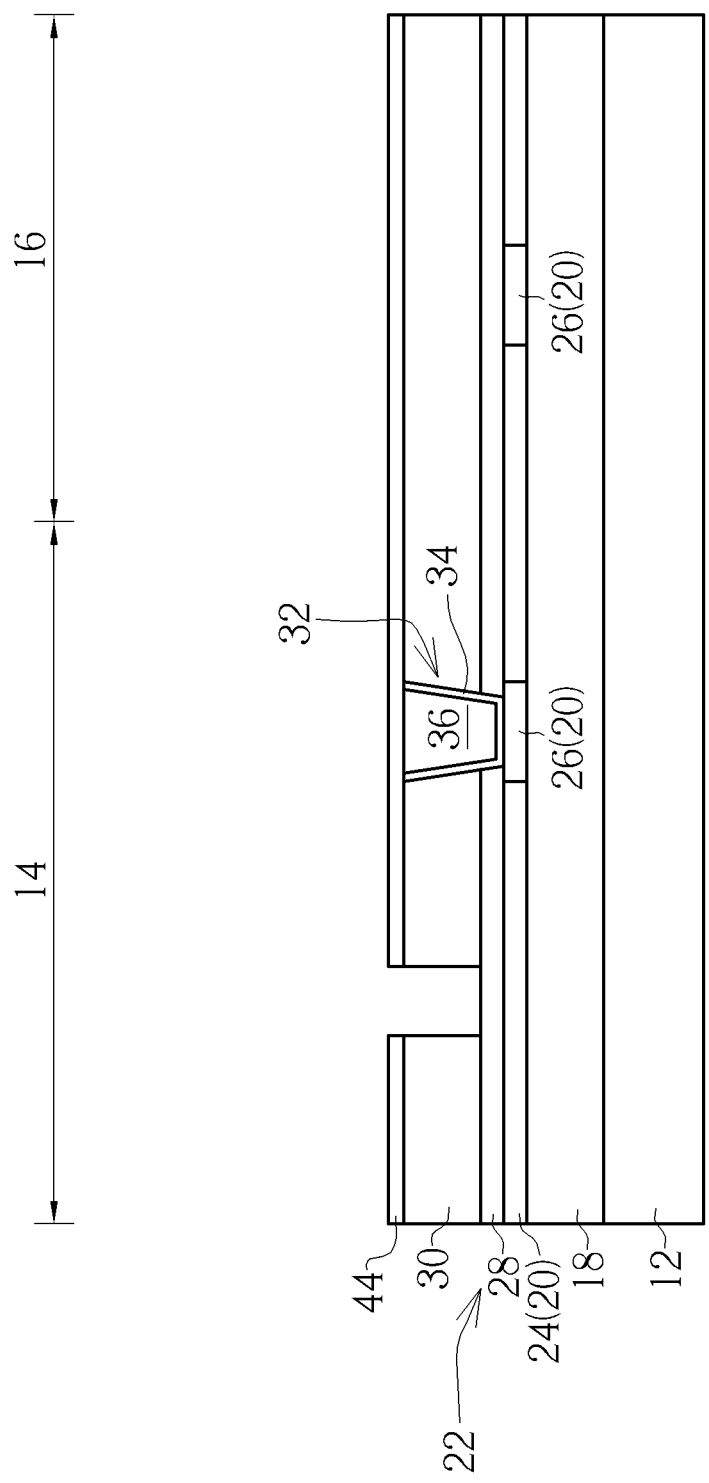

Next, as shown in FIG. 4, a planarizing process such as chemical mechanical polishing (CMP) process is conducted to remove the cap layer 38 completely and expose the top surface of the bottom electrode layer 44. It should be noted that after the cap layer 38 is removed by the CMP process a small portion of the bottom electrode layer 44 could also be removed by the CMP process so that the thickness of the bottom electrode layer 44 is reduced slightly. Preferably, the top surface of the bottom electrode layer 44 still maintains a planar surface having no damage or voids resulted from the CMP process.

Figure 5:
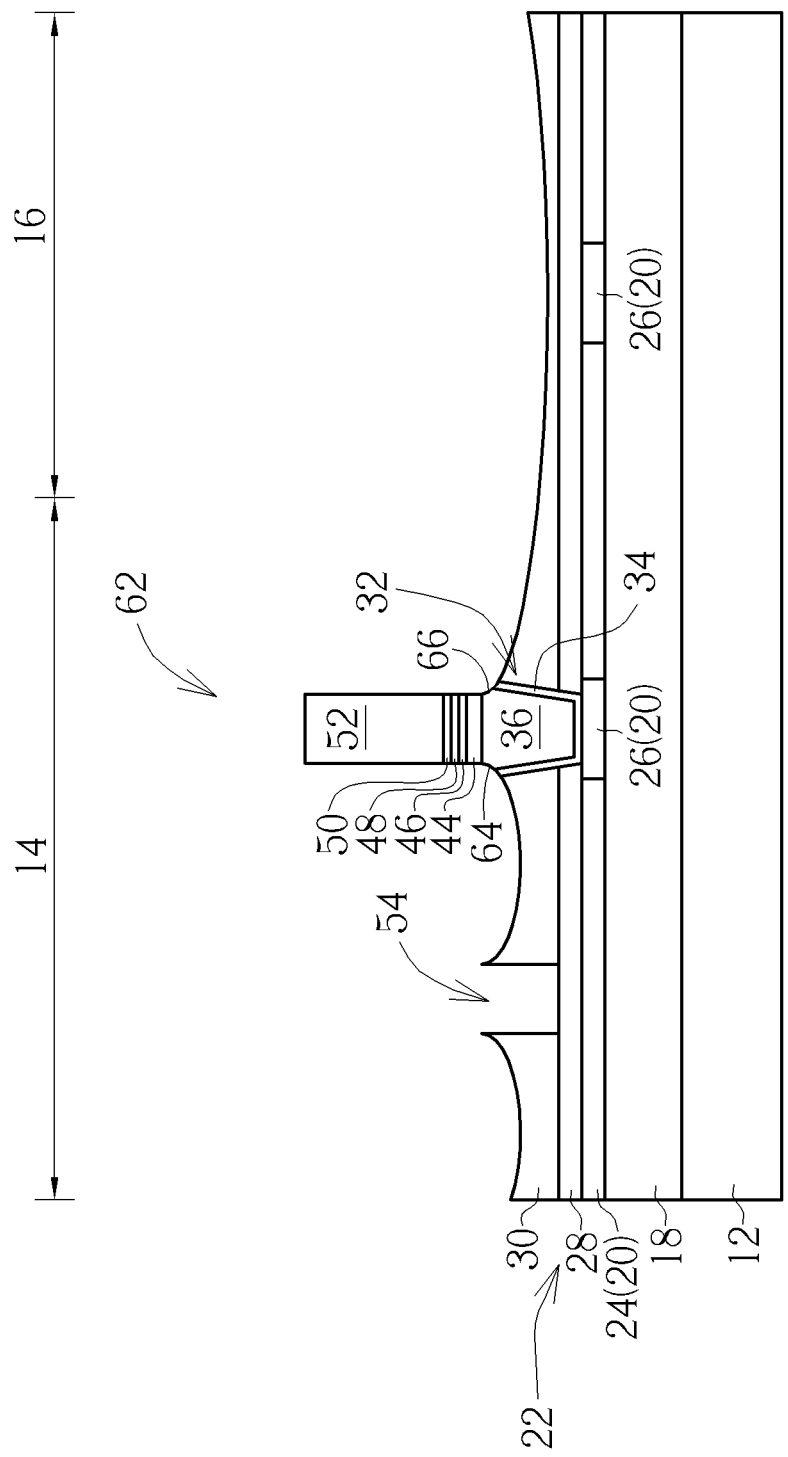

Next, as shown in FIG. 5, a pinned layer 46, a barrier layer 48, a free layer 50, and a top electrode layer 52 are sequentially formed on the bottom electrode layer 44 and filled into the trench 42, and then a photo-etching process is conducted to pattern the top electrode layer 52, the free layer 50, the barrier layer 48, the pinned layer 46, and the bottom electrode layer 44 to form a MTJ 62 and expose the alignment mark 56 again. In this embodiment, the pinned layer 46 could be made of antiferromagnetic (AFM) material including but not limited to for example ferromanganese (FeMn), platinum manganese (PtMn), iridium manganese (IrMn), nickel oxide (NiO), or combination thereof, in which the pinned layer 46 is formed to fix or limit the direction of magnetic moment of adjacent layers. The barrier layer 48 could include oxide containing insulating material such as but not limited to for example aluminum oxide (AlO$_x$) or magnesium oxide (MgO). The free layer 50 could be made of ferromagnetic material including but not limited to for example iron, cobalt, nickel, or alloys thereof such as cobalt-iron-boron (CoFeB), in which the magnetized direction of the free layer 50 could be altered freely depending on the influence of outside magnetic field. The top electrode layer 52 and the bottom electrode layer 44 could be made of same or different conductive materials while the two layers 52, 44 could all be selected from the group consisting of Ta, Pt, Cu, Au, and Al.

It should be noted that an ion beam etching (IBE) process is preferably conducted to remove part of the top electrode layer 52, part of the free layer 50, part of the barrier layer 48, part of the pined layer 46, part of the bottom electrode layer 44, and part of the IMD layer 30 to form the MTJ 62. Due to the characteristics of the IBE process, the top surface of the remaining IMD layer 30 is slightly lower than the top surface of the metal interconnection 32 after the IBE process and the top surface of the IMD layer 30 also reveals a curve or an arc.

It should also be noted that when the IBE process is conducted to remove part of the IMD layer 30, part of the metal interconnection 32 is removed at the same time so that a first slanted sidewall 64 and a second slanted sidewall 66 are formed on the metal interconnection 32 adjacent to the MTJ 62, in which each of the first slanted sidewall 64 and the second slanted sidewall 66 could further include a curve (or curved surface) or a planar surface.

Figure 6:
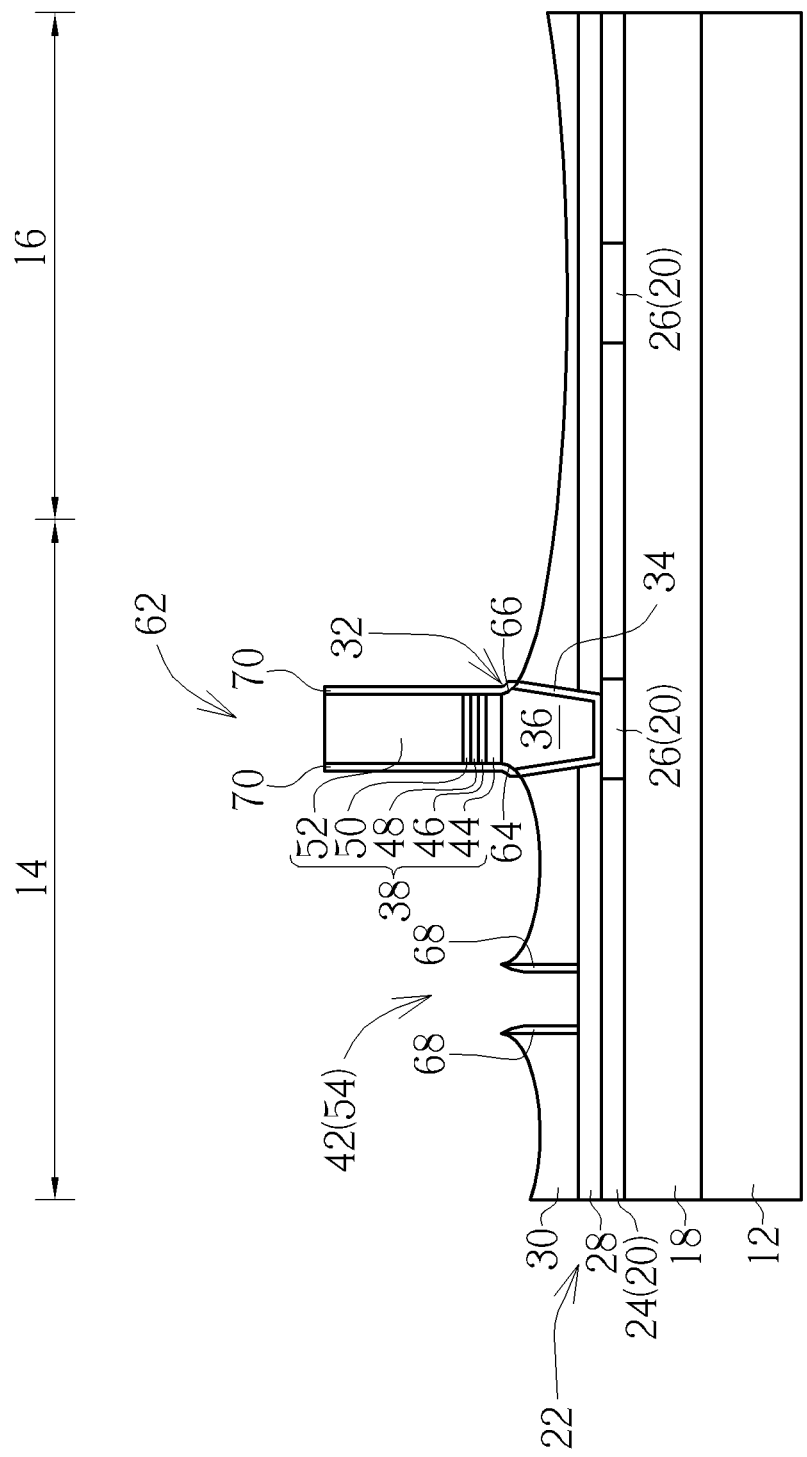

Next, as shown in FIG. 6, a liner (not shown) is formed on the MTJ 62 to cover the surface of the IMD layer 30. In this embodiment, the liner is preferably made of silicon oxide, but could also be made of other dielectric material including but not limited to for example silicon oxide, silicon oxynitride, or silicon carbon nitride. Next, an etching process is conducted to remove part of the liner to form a spacer 70 adjacent to the MTJ 62 and another spacer 68 adjacent to the alignment mark 56, in which the spacer 70 is disposed on the sidewalls of the MTJ 62 and at the same time covering and contacting the first slanted sidewalls 64 and second slanted sidewalls 66 of the metal interconnection 32 directly.

Figure 7:
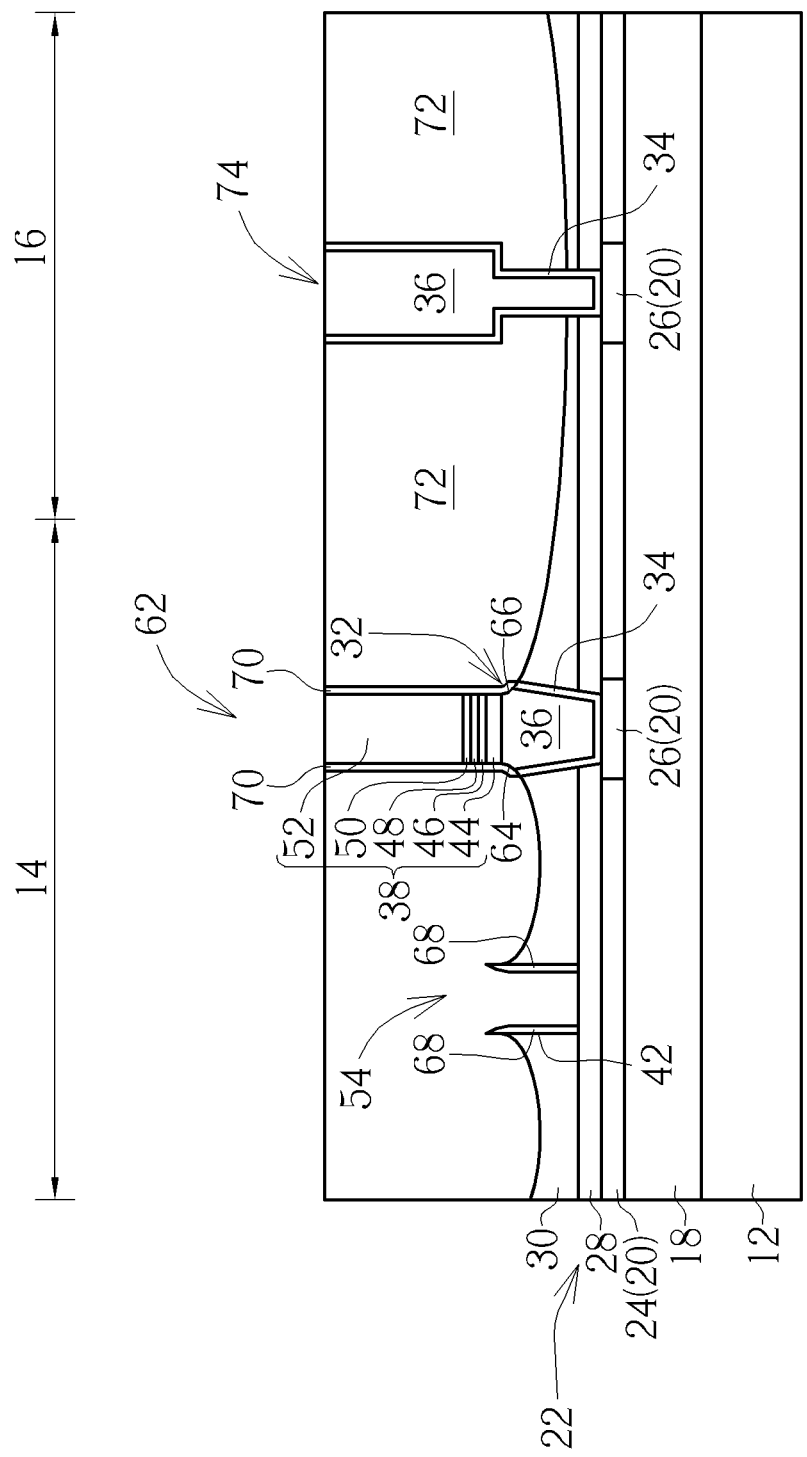

Next, as shown in FIG. 7, another IMD layer 72 is formed on the MTJ region 14 and logic region 16, and a planarizing process such as CMP is conducted to remove part of the IMD layer 72 so that the top surface of the IMD layer 72 is even with the top surface of the MTJ 62. Next, a pattern transfer process is conducted by using a patterned mask (not shown) to remove part of the IMD layer 72 on the logic region 16 to form a contact hole (not shown) exposing the metal interconnection 26 underneath and metals are deposited into the contact hole afterwards. For instance, a barrier layer 34 selected from the group consisting of titanium (Ti), titanium nitride (TiN), tantalum (Ta), and tantalum nitride (TaN) and metal layer 36 selected from the group consisting of tungsten (W), copper (Cu), aluminum (Al), titanium aluminide (TiAl), and cobalt tungsten phosphide (CoWP) could be deposited into the contact holes, and a planarizing process such as CMP could be conducted to remove part of the metals including the aforementioned barrier layer 34 and metal layer 36 to form a contact plug 74 in the contact hole electrically connecting the metal interconnection 26. This completes the fabrication of a semiconductor device according to an embodiment of the present invention.

Overall, the present invention preferably forms a cap layer made of SiN or TEOS on the surface of the bottom electrode layer after the bottom electrode layer of the MTJ is formed, and then using a patterned mask such as patterned resist as mask to remove part of the cap layer, part of the bottom electrode layer, and part of the IMD layer to form an alignment mark. By following this approach it would be desirable to prevent the surface of the bottom electrode layer from oxidizing during the formation of alignment mark or prevent oxidizing agent from creating voids in the bottom electrode layer during the aforementioned CMP process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising:
    forming an inter-metal dielectric (IMD) layer on a substrate;
    forming a metal interconnection in the IMD layer;
    forming a bottom electrode layer on the IMD layer;
    forming a cap layer on the bottom electrode layer; and
    removing part of the cap layer, part of the bottom electrode layer, and part of the IMD layer to form a trench before forming a magnetic tunneling junction (MTJ).

2. The method of claim 1, further comprising performing a planarizing process to remove the cap layer after forming the trench.

3. The method of claim 2, wherein the planarizing process comprises a chemical mechanical polishing process.

4. The method of claim 2, further comprising:
    forming a free layer on the bottom electrode layer after performing the planarizing process;
    forming a top electrode layer on the free layer; and
    patterning the top electrode layer, the free layer, and the bottom electrode layer to form the magnetic tunneling junction (MTJ).

5. The method of claim 1, wherein the bottom electrode layer comprises tantalum nitride (TaN).

6. The method of claim 1, wherein the cap layer comprises tetraethyl orthosilicate (TEOS).

7. The method of claim 1, wherein the cap layer comprises silicon nitride.

* * * * *